(12) United States Patent
Zhu et al.

(10) Patent No.: US 6,211,559 B1
(45) Date of Patent: *Apr. 3, 2001

(54) SYMMETRIC MAGNETIC TUNNEL DEVICE

(75) Inventors: Theodore Zhu, Chandler; Herbert Goronkin, Tempe, both of AZ (US)

(73) Assignee: Motorola, Inc., Schaumburg, IL (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/032,107

(22) Filed: Feb. 27, 1998

(51) Int. Cl.$^7$ ................................................ H01L 29/82
(52) U.S. Cl. ..................... 257/421; 257/295; 257/424; 365/1; 365/7; 365/8; 365/50; 365/55; 365/65; 365/158; 365/170; 365/171; 365/173; 365/232
(58) Field of Search .............................. 257/421, 424, 257/295; 365/158, 7, 8, 171, 173, 1, 232, 55, 170, 32, 65, 66, 50

(56) References Cited

U.S. PATENT DOCUMENTS

| | | | |
|---|---|---|---|
| 5,640,343 | * 6/1997 | Gallagher et al. | 365/171 |
| 5,650,958 | * 7/1997 | Gallagher et al. | 365/173 |
| 5,729,410 | * 3/1998 | Fontana, Jr. et al. | 257/421 |
| 5,757,056 | * 5/1998 | Chui | 257/421 |
| 5,764,567 | * 6/1998 | Parkin | 365/173 |
| 5,768,181 | * 6/1998 | Zhu et al. | 365/158 |
| 5,792,510 | * 8/1998 | Farrow et al. | 427/130 |
| 5,793,697 | * 8/1998 | Scheuerlein | 365/171 |
| 5,801,984 | * 9/1998 | Parkin | 365/173 |
| 5,841,692 | * 11/1998 | Gallagher et al. | 365/173 |
| 5,930,164 | * 7/1999 | Zhu | 365/158 |

* cited by examiner

*Primary Examiner*—Wael Fahmy
*Assistant Examiner*—Matthew E. Warren
(74) *Attorney, Agent, or Firm*—Eugene A. Parsons; William E. Koch

(57) ABSTRACT

A symmetric magnetic tunnel device including first and second magnetic tunnel junctions each including a pinned magnetic layer, an insulating tunnel layer and a free magnetic layer stacked in parallel juxtaposition to allow tunneling of electrons through the insulating tunnel layer between the pinned and free magnetic layers. The first and second magnetic tunnel junctions positioned in parallel juxtaposition so as to form a continuous electron path through the first and second magnetic tunnel junctions and to provide a cell signal across the first and second magnetic tunnel junctions greater than a cell signal across each of the first and second magnetic tunnel junctions individually.

17 Claims, 1 Drawing Sheet

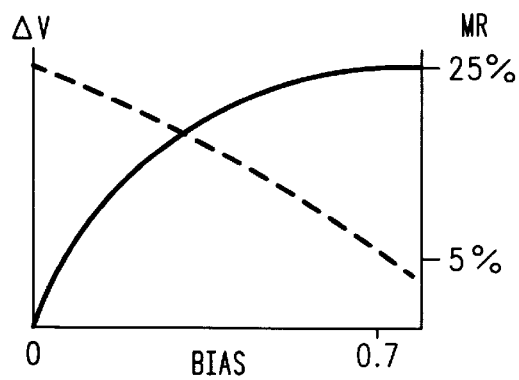
*FIG. 1*
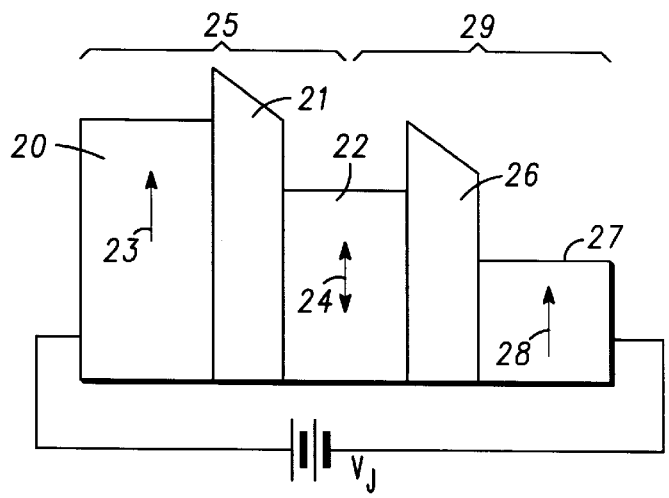
*FIG. 2*
*FIG. 3*
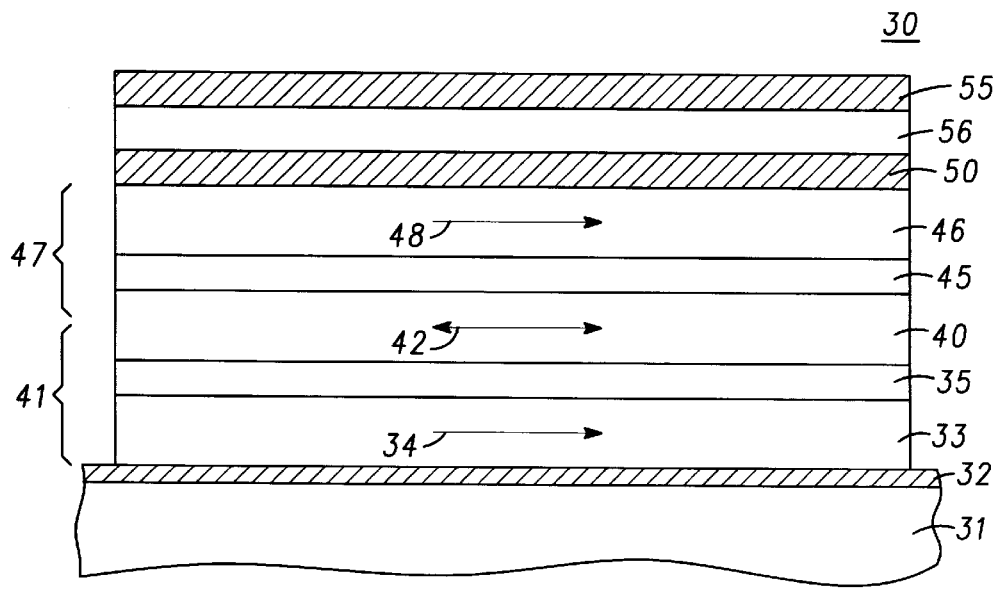

SYMMETRIC MAGNETIC TUNNEL DEVICE

FIELD OF THE INVENTION

The present invention pertains to magnetic tunnel junctions in magnetic memory devices and more particularly to symmetric magnetic tunnel devices.

BACKGROUND OF THE INVENTION

A magnetic random access memory (MRAM) is a non-volatile memory which basically includes a magnetoresistive (MR) cell, a sense line, and a word line. The MRAM employs the MR effect to store memory states. Magnetic vectors in one or all of the layers of MR material are switched very quickly from one direction to an opposite direction when a magnetic field is applied to the MR cell over a certain threshold. According to the direction of the magnetic vectors in the MR cell, states are stored, and the MR cell maintains these states even without a magnetic field being applied.

The specific type of memory cell being addressed herein is commonly referred to as a magnetic tunneling cell or junction and uses multi-layer magnetoresistive materials (MR) and also utilizes dimensions below one micron, in order to increase density. In this type of cell a non-conductive layer is disposed between the multi-layers of magnetic material. The magnetization vectors are generally parallel to the length of the magnetic material instead of the width but sense current tunnels through the non-conducting layer from one layer of magnetic material to the other, rather than being conducted lengthwise by an intervening conductive layer.

The problem is that in most MR cells the MR ratio is relatively low (e.g. 10% or less) and, consequently, the cell signal ($\Delta V$), which is defined as the difference in bias voltage at a constant sense current between the two memory states, is low. As a result, reading or sensing the state stored in the MR cell can be relatively difficult. Some attempts have been made to increase the MR ratio of magnetic tunneling cells, which attempts still result in an MR ratio of less than 30%. See for example, U.S. Pat. No. 5,650,958, entitled "Magnetic Tunnel Junctions with Controlled Magnetic Response", issued Jul. 22, 1997.

Accordingly, it is highly desirable to provide magnetic tunnel junctions or cells with increased cell signals and without increasing the magnetic field required for writing and reading.

It is a purpose of the present invention to provide a new and improved symmetric magnetic tunnel device with increased cell signal.

It is another purpose of the present invention to provide a new and improved symmetric magnetic tunnel device including an increased cell signal without changing the amount of magnetic field required for switching states.

It is a further purpose of the present invention to provide a new and improved symmetric magnetic tunnel device with increased cell signal while maintaining high speed and low power consumption.

SUMMARY OF THE INVENTION

The above problems and others are at least partially solved and the above purposes and others are realized in a symmetric magnetic tunnel device including a plurality of magnetic tunnel junctions each including a pinned magnetic layer, an insulating tunnel layer and a free magnetic layer stacked in parallel juxtaposition to allow tunneling of electrons through the insulating tunnel layer between the pinned and free magnetic layers. The plurality of magnetic tunnel junctions are positioned in parallel juxtaposition so as to form a continuous electron path through the plurality of magnetic tunnel junctions and to provide a cell signal across the plurality of magnetic tunnel junctions greater than the cell signal across each of the magnetic tunnel junctions individually.

In a preferred embodiment the plurality of magnetic tunnel junctions include two tunnel junctions which share a common free magnetic layer therebetween. Generally, the plurality of magnetic tunnel junctions includes a number of magnetic tunnel junctions determined by a total resistance across the plurality of magnetic tunnel junctions and a sense voltage required to produce a sense current through the plurality of magnetic tunnel junctions, wherein the sense voltage is less than a breakdown voltage for the plurality of magnetic tunnel junctions.

BRIEF DESCRIPTION OF THE DRAWINGS

Referring to the drawings:

FIG. 1 is a graphical representation of the change of voltage and cell signal versus change in bias applied to a single magnetic tunnel junction;

FIG. 2 is a conduction band diagram for a symmetric magnetic tunnel junction in accordance with the present invention; and FIG. 3 is a simplified sectional view of a symmetric magnetic tunnel device in accordance with the present invention.

DESCRIPTION OF THE PREFERRED EMBODIMENT

Turning now to the figures and FIG. 1 specifically, a graphical representation of the cell signal ($\Delta V$) versus a bias ($V_J$) applied across a single tunnel junction is illustrated by the left vertical and horizontal axes. In this instance a single tunnel junction may be similar to, for example, the single tunnel junction described in U.S. Pat. No. 5,650,958, entitle "Magnetic Tunnel Junctions with Controlled Magnetic Response", issued Jul. 22, 1997.

The single tunnel junction includes a pinned magnetic layer and a free magnetic layer separated by an insulating layer. The pinned magnetic layer has a magnetic orientation pinned in a single direction. The free magnetic layer has a magnetic orientation which is either parallel or antiparallel with the pinned magnetic orientation. When the magnetic orientations are parallel the resistance across the junction is a minimum and when the magnetic orientations are antiparallel the resistance across the junction is a maximum. The ratio of the minimum resistance to the maximum resistance is known as the MR ratio. The cell signal, $\Delta V$, represented by the left vertical axis in FIG. 1 is defined as the difference of the voltage drop across the single tunnel junction when the magnetic orientations are antiparallel and the voltage drop across the single tunnel junction when the magnetic orientations are parallel.

As illustrated by a solid line curve 10, $\Delta V$ increases rapidly with an increase in bias applied across the single tunnel junction. Also, the MR ratio, represented by a broken line 11, drops rapidly (e.g. from approximately a 25% maximum to approximately a 5% minimum) with an increase in bias applied across the single tunnel junction. Specifically, a single tunnel junction biased at 5 mv has an MR ratio equal to 20%. When the bias is increased to 200 mv the MR ratio decreases to 12%. In order to maintain a high MR ratio it is necessary to limit the bias applied to a single tunnel junction to less than 30 mv. This dependence of the MR ratio on the bias severely limits the output signal which can be obtained and introduces many undesirable variables due to manufacturing tolerances, speed, etc.

Referring specifically to FIG. 2, a conduction band diagram for a symmetric magnetic tunnel junction in accordance with the present invention is illustrated. In this embodiment, the symmetric tunnel junction includes a first pinned magnetic layer represented by a portion 20 of the conduction band, an insulating tunnel layer or barrier layer 21, and a free magnetic layer 22. Pinned magnetic layer 20 has a magnetic orientation, represented by a vector 23, which is in the plane of layer 22 and pinned so as to always point in the same direction. Insulating tunnel layer 21 is sandwiched between layers 20 and 22 so as to be in intimate contact with both layers 20 and 22 so that electrons are able to tunnel from the higher energy conduction band of layer 20, through the barrier of insulating tunnel layer 21 and into layer 22. Free magnetic layer 22 has a magnetic orientation, represented by a vector 24 which is constrained to lie within the plane of layer 22 but may be oriented either parallel to vector 23 or antiparallel to vector 23.

Pinned magnetic layer 20, insulating tunnel layer 21, and free magnetic layer 22 define a first magnetic tunnel junction 25. The parallel or antiparallel orientation of vector 24 is changed by the application of a magnetic field to layer 22 with the direction of the magnetic field determining the direction of vector 24. Here it should be noted that since vector 23 of pinned magnetic layer 20 is fixed in the illustrated orientation, any magnetic fields created to change the orientation of vector 24 will have no effect on vector 23. Further, as described above, when vectors 23 and 24 are oriented in parallel the electrical resistance across magnetic tunnel junction 25 is minimum and when vectors 23 and 24 are oriented antiparallel the electrical resistance across magnetic tunnel junction 25 is a maximum.

The symmetric tunnel junction of FIG. 2 further includes a second insulating tunnel layer or barrier layer 26 and a second pinned magnetic layer 27. Pinned magnetic layer 27 has a magnetic orientation, represented by a vector 28, which is in the plane of layer 27 and pinned so as to always point in the same direction as vector 23 of layer 20. Insulating tunnel layer 26 is sandwiched between layers 22 and 27 so as to be in intimate contact with both layers 22 and 27 so that electrons are able to tunnel from the higher energy conduction band of layer 22, through the barrier of insulating tunnel layer 26 and into layer 27.

Free magnetic layer 22, insulating tunnel layer 26, and pinned magnetic layer 27 define a second magnetic tunnel junction 29. It should be noted that in magnetic tunnel junction 29 also, vector 28 of pinned magnetic layer 27 is fixed in the illustrated orientation, so that any magnetic fields created to change the orientation of vector 24 will have no effect on vector 28. Further, as described above, when vectors 23 and 28 are oriented in parallel with vector 24 the electrical resistance across the symmetric magnetic tunnel junction is minimum and when vectors 23 and 28 are oriented antiparallel with vector 24 the electrical resistance across the symmetric magnetic tunnel junction is a maximum.

Still referring to FIG. 2, a junction bias voltage ($V_J$) is applied across the symmetric tunnel junction. In the symmetric tunnel junction including back-to-back oriented magnetic tunnel junctions 25 and 29, the total bias voltage appears substantially equally divided across each of the magnetic tunnel junctions 25 and 29. For example, if $V_J$ equals 200 mv, the bias across magnetic tunnel junction 25 is 100 mv and the bias across magnetic tunnel junction 29 is 100 mv. Therefore, the MR ratio for magnetic tunnel junction 25 is approximately 16% ($\Delta V \sim 16$ mv) and the MR ratio for magnetic tunnel junction 29 is approximately 16% ($\Delta V \sim 16$ mv) with the total cell signal of the symmetric tunnel junction being 32 mv. Therefore, magnetic tunnel junctions 25 and 29 are positioned in parallel juxtaposition so as to form a continuous electron path through magnetic tunnel junctions 25 and 29 and to provide a cell signal across magnetic tunnel junctions 25 and 29 greater than the cell signal across each of magnetic tunnel junction 25 and magnetic tunnel junction 29, individually.

In the fabrication of a magnetic tunnel junction, such as junctions 25 or 29, insulating tunnel layers or barrier layers 21 or 26 are generally formed as thin as practical, i.e. in a range of approximately 15 Å to 25 Å to reduce the resistance of the junction as much as possible. It will of course be understood that making insulating tunnel layers or barrier layers 21 or 26 too thin results in voltage breakdown and shorting between layers 23,24 or 24, 28 without achieving the tunneling effect. Thus, each magnetic tunnel junction has a resistance which can only be reduced to a definite limit. Further, as more magnetic tunnel junctions are combined to form a composite tunnel junction, the minimum bias voltage which can be applied across the composite tunnel junction to achieve operation must be increased to drive current through the increased resistance and this increased bias voltage is not desirable for low power, low voltage applications.

Turning now to FIG. 3, a simplified sectional view of a specific embodiment of a symmetric magnetic tunnel device 30 in accordance with the present invention is illustrated. Symmetric magnetic tunnel device 30 is formed on a substrate 31 which may be, for example, a semiconductor substrate or the like in which control and integrating circuits (not shown) are also formed. Also, while substrate 31 is illustrated as a single layer of material it will be understood that it may include from one to several layers which are utilized in the formation of the integrated circuits and the term "substrate" is intended to include all such layers.

A first contact layer 32 is positioned on the surface of substrate 31 and generally includes a metal or the like deposited by conventional semiconductor techniques. A pinned magnetic layer 33 is positioned on contact layer 32 and, in some special applications may at least partially include contact layer 32. It should also be understood that contact layer 32 extends outwardly from symmetric magnetic tunnel junction 30 to provide an external electrical connection and in the instance where device 30 is one of an array of symmetric magnetic tunnel devices it may be a common contact or a row or column bus.

A vector 34 (represented by a one headed arrow) represents the magnetization of layer 33 and illustrates that the magnetization is oriented in the plane of pinned magnetic layer 33 and is pinned to a specific direction (i.e. to the right in FIG. 3). Generally, pinned magnetic layer 33 includes one or more sublayers of magnetic material and one or more sublayers of antiferromagnetic material. For example, pinned magnetic layer 33 may include one of NiFeCo/FeMn, NiFe/FeMn, NiFeCo/IrMn, Co/Ru/Co/FeMn, or combinations thereof. Also, pinned magnetic layer 33 generally has a thickness in a range of approximately 20 Å to approximately 100 Å. The antiferromagnetic material is utilized to pin magnetic vector 34 along a preferred magnetic axis, so that layer 33 has a unidirectional magnetization. Additional information on the pinning process can be obtained from a copending application entitled "Low Switching Field magnetoresistive Tunneling Junction for High Density Arrays", Ser. No. 08/993,768, filed Dec. 18, 1997, now U.S. Pat. No. 5,966,323, and a copending application entitled "Low Aspect Ratio Magnetoresistive Tunneling Junction", Ser. No. 08/993,996, filed on Dec. 18, 1997, now U.S. Pat. No. 5,959,880, both assigned to the assignee of the present application and both included herein by reference.

An insulating tunnel layer 35 is positioned on pinned magnetic layer 33 and a free magnetic layer 40 is positioned on insulating tunnel layer 35. Pinned magnetic layer 33, insulating tunnel layer 35, and free magnetic layer 40 are constructed and cooperate to define a magnetic tunnel junction 41. As described above, insulating tunnel layer 35 forms a barrier between magnetic layers 33 and 40 and is generally formed as thin as practical, i.e. in a range of approximately 15 Å to 25 Å to reduce the resistance of the junction as much as possible. Further, insulating tunnel layer 35 is formed of any convenient insulating material, such as $Al_2O_3$ or the like. Free magnetic layer 40 includes a fixed polarization axis lying in the plane of layer 40 and a magnetic vector 42 (represented by a two headed arrow) directed in either of two directions parallel to the polarization axis.

An insulating tunnel layer 45 is positioned on free magnetic layer 40 and a pinned magnetic layer 46 is positioned on insulating tunnel layer 45. Free magnetic layer 40, insulating tunnel layer 45, and pinned magnetic layer 46 are constructed and cooperate to define a second magnetic tunnel junction 47. In this specific embodiment, pinned magnetic layer 46 is constructed similar to pinned magnetic layer 33 and a vector 48 (represented by a one headed arrow) represents the magnetization of layer 46 and illustrates that the magnetization is oriented in the plane of pinned magnetic layer 46 and is pinned to a specific direction (i.e. to the right in FIG. 3). Generally, pinned magnetic layer 46 includes one or more sublayers of magnetic material and one or more sublayers of antiferromagnetic material. For example, pinned magnetic layer 46 may include one of NiFeCo/FeMn, NiFe/FeMn, NiFeCo/IrMn, Co/Ru/Co/FeMn, or combinations thereof. Also, pinned magnetic layer 46 generally has a thickness in a range of approximately 20 Å to approximately 100 Å.

A second electrical connection, in the form of a word line 50 is positioned on the upper surface of pinned magnetic layer 46. Also, a digital line 55 is positioned over and electrically isolated from word line 50 by a layer 56 of dielectric material. Word line 50 and digital line 55 both extend beyond symmetric magnetic tunnel junction 30 to provide external electrical connections and may, for example, be row or column buses in a two dimensional array of symmetric magnetic tunnel junctions.

In the operation of symmetric magnetic tunnel device 30, the magnetization (represented by magnetic vectors 34 and 48, respectively) of both pinned magnetic layers 33 and 46 are directed in the same direction, i.e. to the right in FIG. 3. The magnetization or magnetic vector 42 of free magnetic layer 40 is directed either in parallel or antiparallel to vectors 34 and 48. When magnetic vector 42 of free magnetic layer 40 is directed parallel to magnetic vectors 34 and 48, the resistance between electrical contacts 32 and 50 is a minimum and when magnetic vector 42 of free magnetic layer 40 is directed antiparallel to magnetic vectors 34 and 48, the resistance between electrical contacts 32 and 50 is a maximum. That is, when a constant current sense or read signal is applied across symmetric magnetic tunnel device 30 between electrical contacts 32 and 50, the difference in the voltage drops between the antiparallel and parallel modes will differ by approximately 32%. In other words, when a bias of 200 mv is sensed between electrical contacts 32 and 50 with symmetric magnetic tunnel device 30 in the antiparallel mode, a bias of approximately 64 mv less will be sensed with symmetric magnetic tunnel device 30 in the parallel mode.

To write or store information in symmetric magnetic tunnel device 30 sufficient electrical current is applied to either on or both word line 50 and digital line 55. Generally, when symmetric magnetic tunnel device 30 is included in a two dimensional array of junctions, digital line 55 and all similar digital lines extend in rows and word line 50 and all similar word lines extend in columns with each crossing of a row and a column occurring at one junction. Addressing of each individual junction is provided by applying a fraction of the write current to the appropriate digital line and another fraction of the write current to the appropriate word line. The two current fractions combine to produce sufficient magnetic field at the addressed junction (and only at the addressed junction) to switch the magnetization of free magnetic layer 40 but not pinned magnetic layers 33 and 46.

Accordingly, a new and improved symmetric magnetic tunnel device with increased cell signal is disclosed. The cell signal of the present symmetric magnetic tunnel device is greater than the cell signal of prior art magnetic tunnel junctions. The new and improved symmetric magnetic tunnel device exhibits an increased cell signal without changing the amount of magnetic field required for switching states and while maintaining high speed and low power consumption. Further, the substantially greater cell signal allows peripheral circuitry (e.g. sensing circuits and the like) to be constructed much simpler, less expensive and less sensitive.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A magnetic tunnel device comprising first and second magnetic tunnel junctions each including a pinned magnetic layer, and an insulating tunnel layer, and sharing a common free magnetic layer stacked in parallel juxtaposition to allow tunneling of electrons through each of the insulating tunnel layers between the pinned layers and the common free magnetic layer, the first and second magnetic tunnel junctions being positioned in parallel juxtaposition so as to form a continuous electron path in series through the magnetic tunnel junction and to provide a cell signal across both the first and second magnetic tunnel junctions greater than a cell signal across each of the magnetic tunnel junctions individually, and wherein both pinned magnetic layers each have a magnetic orientation pointing in substantially the same direction and parallel to each other, and wherein the free magnetic layer has a magnetic oriented in the plane of the free magnetic layer and moveable to be either pointing in the same direction or pointing in the opposite direction to the magnetic orientation of the pinned magnetic layer.

2. A symmetric magnetic tunnel device as claimed in claim 1 wherein the pinned magnetic layers of each of the plurality of magnetic tunnel junctions are pinned by adjacent anti-ferromagnetic material.

3. A symmetric magnetic tunnel device comprising a plurality of magnetic tunnel junctions each including a pinned magnetic layer, an insulating tunnel layer and a free magnetic layer stacked in parallel juxtaposition to allow tunneling of electrons through the insulating tunnel layer between the pinned and free magnetic layers, the plurality of magnetic tunnel junctions being positioned in parallel juxtaposition so as to form a continuous electron path through the plurality of magnetic tunnel junctions and to provide a cell signal across the plurality of magnetic tunnel junctions greater than a cell signal across each of the magnetic tunnel junctions individually, wherein the MR ratio across the plurality of magnetic tunnel junctions is greater than 30%.

4. A symmetric magnetic tunnel device as claimed in claim 1 wherein the first and second magnetic tunnel junctions includes a number of magnetic tunnel junctions determined by a total resistance across the first and second magnetic tunnel junctions and a sense voltage required to produce a sense current in series through the first and second magnetic tunnel junctions, wherein the sense voltage is less than twice a breakdown voltage for one of the magnetic tunnel junctions.

5. A symmetric magnetic tunnel device comprising:
   a first magnetic tunnel junction including a pinned magnetic layer, an insulating tunnel layer and a common free magnetic layer stacked in parallel juxtaposition to allow tunneling of electrons through the insulating tunnel layer between the pinned layer and the common free magnetic layer;
   a second magnetic tunnel junction including a pinned magnetic layer, an insulating tunnel layer and the common free magnetic layer stacked in parallel juxtaposition to allow tunneling of electrons through the insulating tunnel layer between the pinned layer and the common free magnetic layer;
   the first and second magnetic tunnel junctions being positioned in parallel juxtaposition so as to form a continuous electron path in series through the first and second magnetic tunnel junctions and to provide a cell signal across the first and second magnetic tunnel junctions greater than a cell signal across each of the first and second magnetic tunnel junctions individually.

6. A symmetric magnetic tunnel device as claimed in claim 5 wherein the pinned magnetic layers of each of the first and second magnetic tunnel junctions are pinned by adjacent anti-ferromagnetic material.

7. A symmetric magnetic tunnel device comprising:
   a first magnetic tunnel junction including a pinned magnetic layer, an insulating tunnel layer and a free magnetic layer stacked in parallel juxtaposition to allow tunneling of electrons through the insulating tunnel layer between the pinned and free magnetic layers;
   a second magnetic tunnel junction including a pinned magnetic layer, an insulating tunnel layer and a free magnetic layer stacked in parallel juxtaposition to allow tunneling of electrons through the insulating tunnel layer between the pinned and free magnetic layers;
   the first and second magnetic tunnel junctions being positioned in parallel juxtaposition so as to form a continuous electron path through the first and second magnetic tunnel junctions and to provide a cell signal across the first and second magnetic tunnel junctions greater than a cell signal across each of the first and second magnetic tunnel junctions individually,
   wherein the cell signal across the first and second magnetic tunnel junctions is greater than 30 mv.

8. A symmetric magnetic tunnel device for providing a signal comprising:
   a substrate;
   a first electrical contact positioned on the substrate;
   a first pinned magnetic layer positioned on the contact layer;
   a first insulating tunnel layer positioned on the first pinned magnetic layer;
   a free magnetic layer positioned on the first insulating tunnel layer;
   a second insulating tunnel layer positioned on the free magnetic layer;
   a second pinned magnetic layer positioned on the second insulating layer; and
   a second electrical contact positioned in electrical communication with the second pinned magnetic layer, the signal provided across the first and second electrical contacts and being greater than signals appearing across the first and second insulating tunnel layers,
   the first and second pinned magnetic layers each having a magnetization oriented in the plane of the first and second pinned magnetic layers, respectively, and pointing in the same direction as each other, and the free magnetic layer having a magnetization oriented in the plane of the free magnetic layer and moveable to one of pointing in either the same or opposite directions as the magnetizations of the first and second pinned magnetic layers.

9. A symmetric magnetic tunnel device as claimed in claim 8 wherein the substrate is a semiconductor substrate.

10. A symmetric magnetic tunnel device as claimed in claim 8 wherein the first and second pinned magnetic layers each include sublayers of magnetic material and antiferromagnetic material.

11. A symmetric magnetic tunnel device as claimed in claim 10 wherein the first and second pinned magnetic layers each include at least one of the group consisting of NiFeCo/FeMn, NiFe/FeMn, NiFeCo/IrMn, Co/Ru/Co/FeMn, or combinations thereof.

12. A symmetric magnetic tunnel device as claimed in claim 8 wherein the first and second insulating tunnel layers include $Al_2O_3$.

13. A symmetric magnetic tunnel device as claimed in claim 8 wherein the first and second pinned magnetic layers have a thickness in a range of approximately 20 Å to approximately 100 Å.

14. A symmetric magnetic tunnel device as claimed in claim 8 wherein the first and second insulating tunnel layers have a thickness in a range of approximately 15 Å to approximately 25 Å.

15. A symmetric magnetic tunnel device for providing a signal comprising:
   a substrate;
   a first electrical contact positioned on the substrate;
   a first pinned magnetic layer positioned on the contact layer;
   a first insulating tunnel layer positioned on the first pinned magnetic layer;
   a free magnetic layer positioned on the first insulating tunnel layer;
   a second insulating tunnel layer positioned on the free magnetic layer;
   a second pinned magnetic layer positioned on the second insulating layer; and
   a second electrical contact positioned in electrical communication with the second pinned magnetic layer, the signal provided across the first and second electrical contacts and being greater than signals appearing across the first and second insulating tunnel layers,
   the first and second pinned magnetic layers each having a magnetization oriented in the plane of the first and second pinned magnetic layers, respectively, and parallel to each other, and the free magnetic layer having a magnetization oriented in the plane of the free magnetic layer and moveable to one of parallel and antiparallel to the magnetizations of the first and second pinned magnetic layers,
   wherein a cell signal between the first and second electrical contacts is greater than 30 mv.

16. A symmetric magnetic tunnel device as claimed in claim 8 wherein the second electrical contact is a word or sense line for sensing the orientation of the magnetization of the free magnetic layer.

17. A symmetric magnetic tunnel device as claimed in claim 16 including in addition a digital or write line electrically insulated from the word or sense line and positioned in magnetic communication with the free magnetic layer so as to move the orientation of the magnetization of the free magnetic layer to one of parallel and anti-parallel to the magnetizations of the first and second pinned magnetic layers in accordance with a direction of current flowing in the digital or write line.

* * * * *

UNITED STATES PATENT AND TRADEMARK OFFICE
CERTIFICATE OF CORRECTION

PATENT NO. : 6,211,559 B1 Page 1 of 1
DATED : April 3, 2001
INVENTOR(S) : Zhu et al.

It is certified that error appears in the above-identified patent and that said Letters Patent is hereby corrected as shown below:

<u>Column 1,</u>
Line 2, after the Title, please add as a new first paragraph the following paragraph:
    -- This invention was made with Government support under Agreement No. MDA972-96-3-0016 awarded by DARPA. The Government has certain rights in the invention. --

Signed and Sealed this

Nineteenth Day of August, 2003

JAMES E. ROGAN
*Director of the United States Patent and Trademark Office*